(12) United States Patent
Maesaki et al.

(10) Patent No.: US 7,023,228 B2
(45) Date of Patent: Apr. 4, 2006

(54) DYNAMIC BURN-IN METHOD AND APPARATUS

(75) Inventors: Yoshihiro Maesaki, Kawasaki (JP); Hiroshi Teshigawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/796,035

(22) Filed: Mar. 10, 2004

(65) Prior Publication Data

US 2004/0169524 A1  Sep. 2, 2004

Related U.S. Application Data

(63) Continuation of application No. PCT/JP02/09981, filed on Sep. 26, 2002.

(30) Foreign Application Priority Data

Sep. 26, 2001 (JP) ............................. 2001-294159

(51) Int. Cl.
    *G01R 31/26* (2006.01)
(52) U.S. Cl. ...................... 324/760; 324/765
(58) Field of Classification Search ............... 324/73.1, 324/760, 763, 765, 158.1; 438/14, 17
    See application file for complete search history.

(56) References Cited

U.S. PATENT DOCUMENTS

| 5,798,653 | A | * | 8/1998 | Leung, Jr. ..................... 324/760 |
| 5,825,193 | A | * | 10/1998 | Nakata et al. ............... 324/763 |
| 6,518,779 | B1 | * | 2/2003 | Nakata et al. ............... 324/754 |

FOREIGN PATENT DOCUMENTS

| JP | 5-258599 | 10/1993 |
| JP | 10-221411 | 8/1998 |
| JP | 2000-123595 | 4/2000 |

* cited by examiner

*Primary Examiner*—Minh N. Tang
(74) *Attorney, Agent, or Firm*—Staas & Halsey LLP

(57) ABSTRACT

In a dynamic burn-in apparatus wherein a signal output from a signal generator is input to a semiconductor device to be tested in the burn-in tank, a converter is arranged at the output of the signal generator. The converter increases, by N times, the frequency of the signal output from a signal generator. The signal having the increased frequency and output from the converter, is input to the semiconductor device to be tested in the burn-in tank when the burn-in is operated at high-speed. The frequency of the signal is converted to the higher frequency, and the signal having the higher frequency is provided to the semiconductor device. As the result, the burn-in can be done in a shorter time for a high-speed sophisticated semiconductor device.

4 Claims, 7 Drawing Sheets

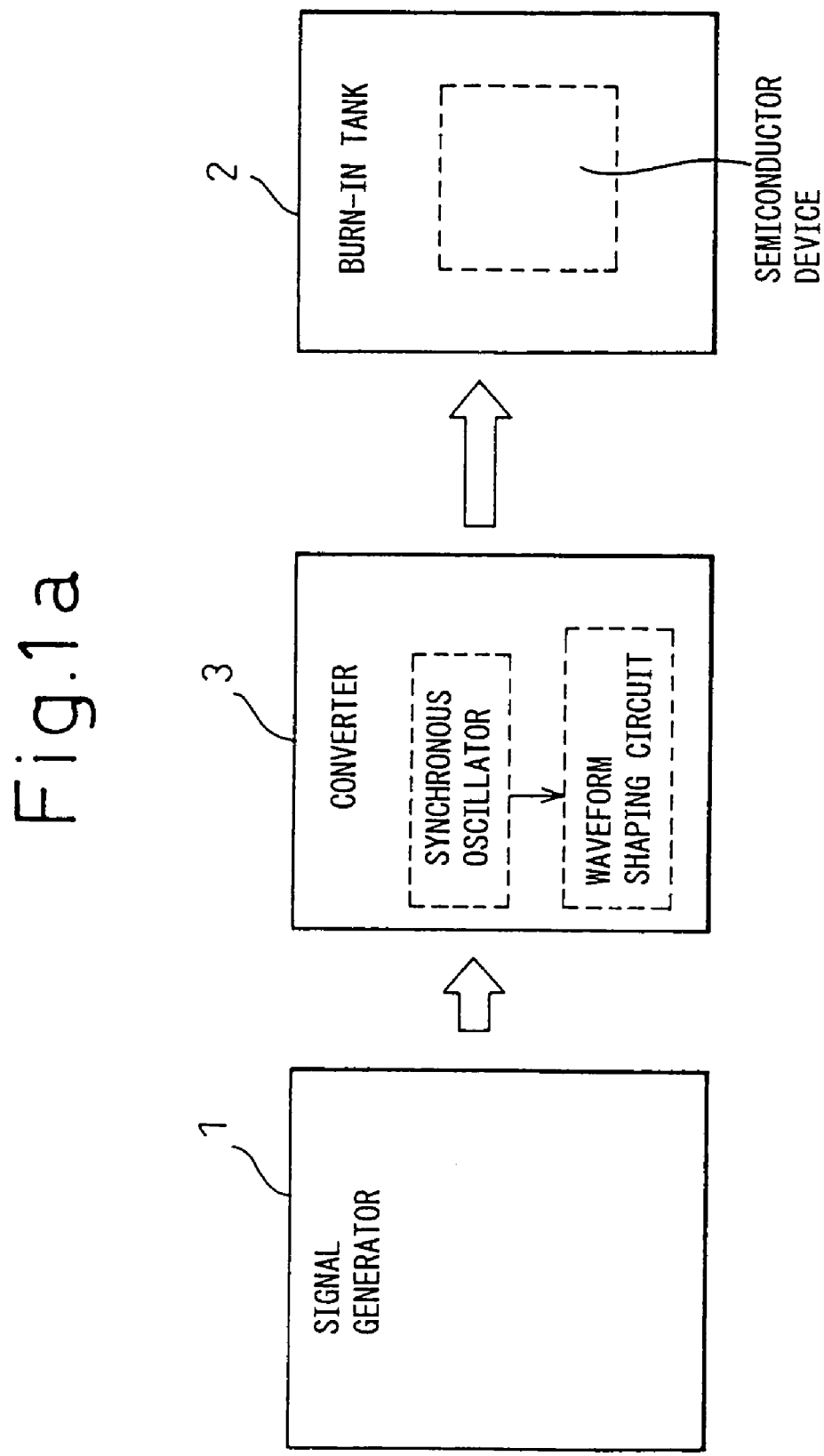

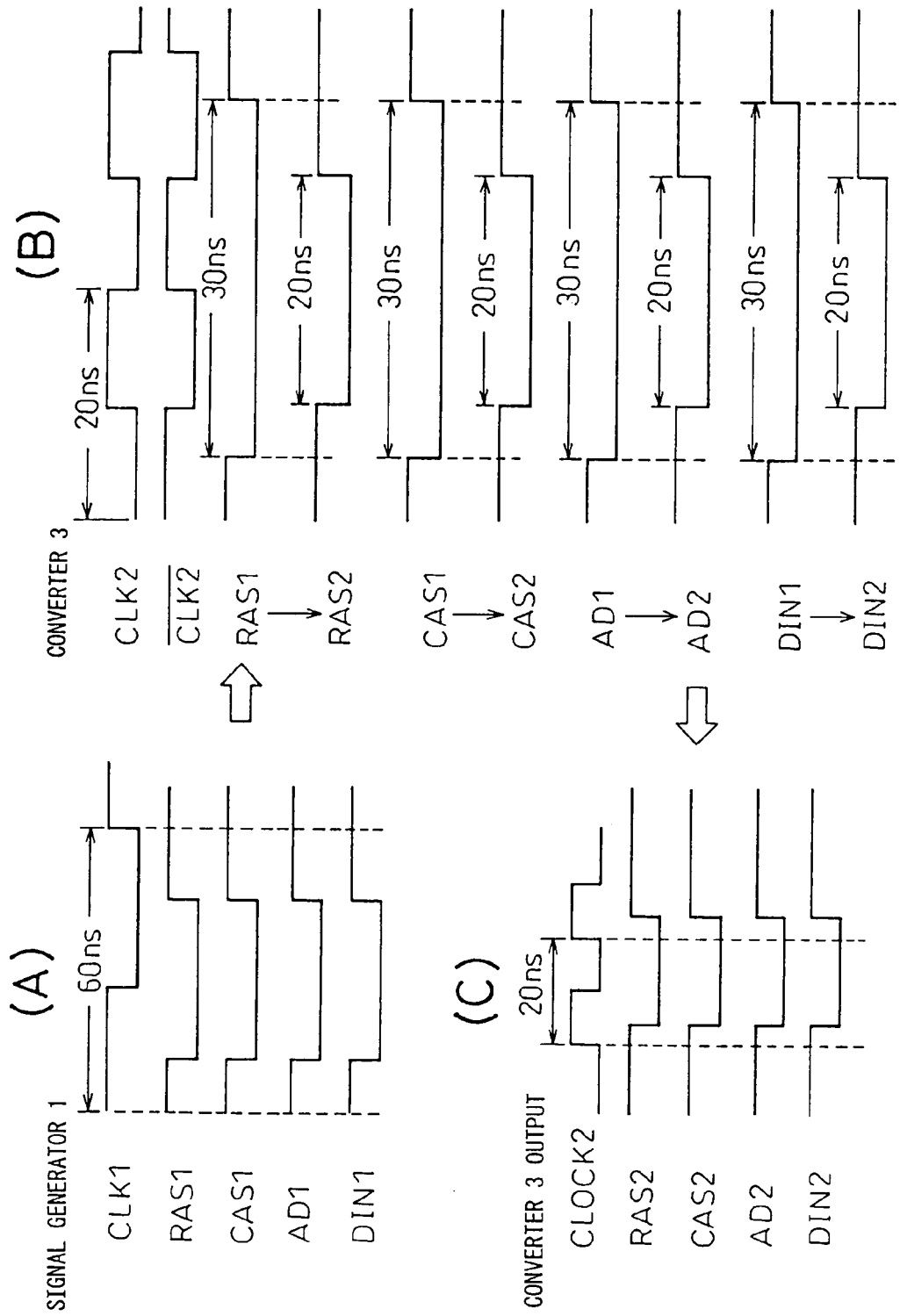

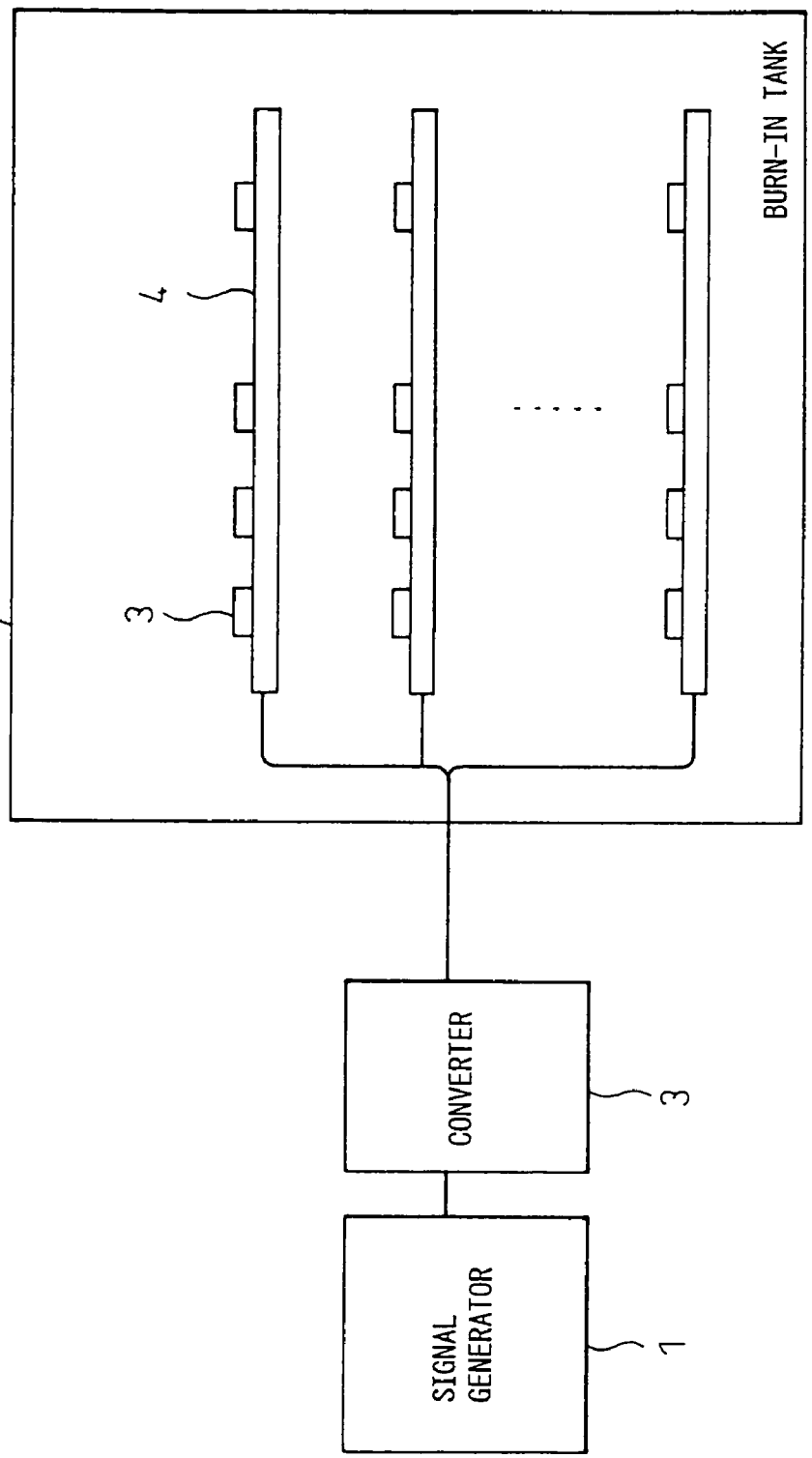

DYNAMIC BURN-IN METHOD AND APPARATUS

CROSS-REFERENCE TO RELATED APPLICATIONS

Continuation of prior application No. PCT/JP02/09981. This is a continuing application, filed under 35 U.S.C. §111(a), of International Application PCT/JP02/09981, filed Sept. 26, 2002, it being further noted that foreign priority benefit is based upon JapaneseJapanese Patent Application 2001-294159 and PCT/JP02/099812001-294159, filed Sep. 26, 2001.

FIELD OF INVENTION

The invention relates to a dynamic burn-in method and to an apparatus, for screening semiconductors that have potential defects and, in particular, to a dynamic burn-in method and to an apparatus, that are operated at high speed.

RELATED ART

Conventionally, for example, before semiconductor devices are used, a dynamic burn-in has been done to detect defective devices among the semiconductor devices. When the burn-in is done, the semiconductor devices are put into a burn-in tank and burn-in signals are input to the semiconductor devices. The burn-in apparatus, for example, consists of a signal generator and a burn-in tank. Semiconductor devices such as large-scale integrated circuits (LSI), which are to be tested, are mounted on a printed circuit board. The printed circuit board is put into the burn-in tank. The burn-in signals from the signal generator are input to the semiconductor devices for a certain period. Thus, the burn-in is done.

Kokai (unexamined patent publication) No. 10-221411 discloses that a custom LSI has a built-in circuit that can generate a burn-in signal. When the burn-in is done, the LSI itself generates the burn-in signal, corresponding to an external clock and control signal.

However, if an LSI has a burn-in signal generating circuit inside itself, a cost of the semiconductor device rises. A general-purpose memory device such as dynamic random access memory (DRAM) or static random access memory (SRAM) is a relatively low-cost item. Therefore, when the burn-in for the general-purpose memory device is done, the external burn-in signal is provided, to the semiconductor devices that should be tested, without a burn-in signal generating circuit being built into the devices.

Recently, general-purpose memory devices have become high-speed sophisticated devices. Correspondingly, a burn-in apparatus that is suitable for high-speed sophisticated devices is desired.

However, the clock frequency of a signal generator for a conventional burn-in apparatus is at most approximately 10 MHz. A burn-in done using the conventional burn-in apparatus is not effective for the high-speed general-purpose memory device whose clock frequency is not less than a 100 MHz. Presently, burn-in is done over an extended time period to achieve an accelerated effect for a high-speed general-purpose memory device.

SUMMARY OF THE INVENTION

The object of the present invention is to provide a dynamic burn-in method, and apparatus, which operates quickly for high-speed and sophisticated semiconductor devices, using a relatively simple converter arranged in the conventional burn-in apparatus.

According to an aspect of the present invention, a certain signal is generated, a frequency of the signal is increased and the signal having the increased frequency is input to a semiconductor device that should be tested when the dynamic burn-in is done.

According to another aspect of the present invention, a dynamic burn-in apparatus, comprising a signal generator and a burn-in tank, where a signal output from the signal generator is provided to a semiconductor device to be tested in the burn-in tank, comprises a converter of the output of the signal generator.

The converter increases the frequency of the signal output from the signal generator to N times the frequency. The signal having N times the frequency output from the converter is provided to the semiconductor device to be tested in the burn-in tank.

Thus, the frequency of the burn-in signal output from the signal generator is converted to the higher frequency. The burn-in signal having the higher frequency is provided to the semiconductor device. Therefore, the dynamic burn-in is operated in a shorter period for the high-speed sophisticated semiconductor device.

Further, the converter, added to the conventional burn-in apparatus, can accelerate the burn-in and shorten the burn-in time. The burn-in apparatus according to the present invention can reduce costs, compared to the prior burn-in apparatus for the high-speed and sophisticated semiconductor device.

BRIEF DESCRIPTION OF DRAWINGS

Hereinafter, the embodiments of the present invention will be described with reference to the accompanying drawings.

FIGS. 1a and 1b show a schematic diagram according to the present invention.

FIG. 2 shows a schematic view of a burn-in apparatus according to an embodiment of the present invention.

DETAILED DESCRIPTION OF PREFERRED EMBODIMENT

First, a conventional burn-in apparatus, to which the present invention is not applied is described in order to clearly show the advantages that the present invention can provide.

Figure 5:
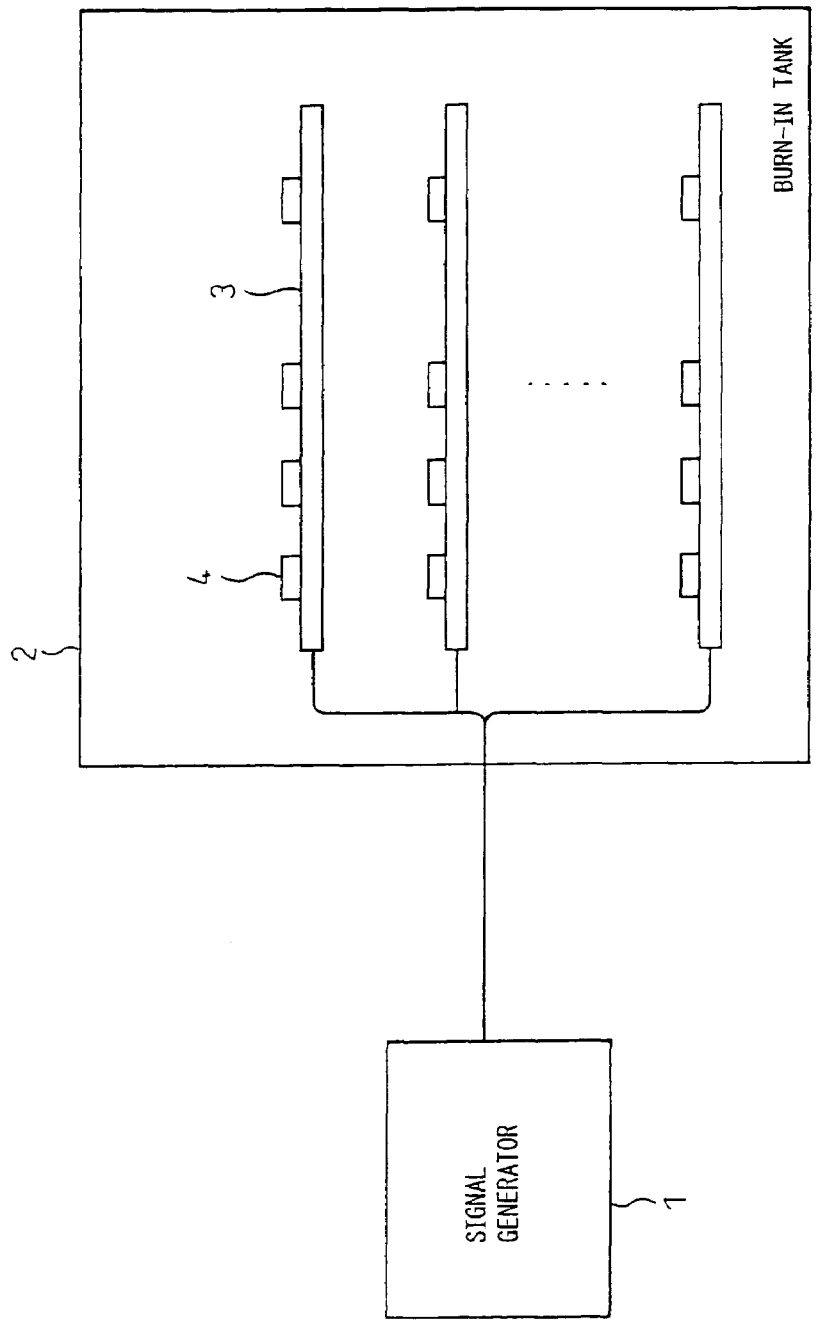
FIG. 5 shows a schematic view of a burn-in apparatus according to a prior art.

FIG. 5 shows a schematic diagram of the conventional burn-in apparatus. The burn-in apparatus has a signal generator 1 and a burn-in tank 2. Semiconductor devices 4 such as LSIs, which are to be tested, are mounted on a printed circuit board 3. The printed circuit board 3 is put into the burn-in tank 2. A burn-in signal output from the signal generator 1 is input to the semiconductor device 4 in a predetermined period when the burn-in is operated.

Figure 6:
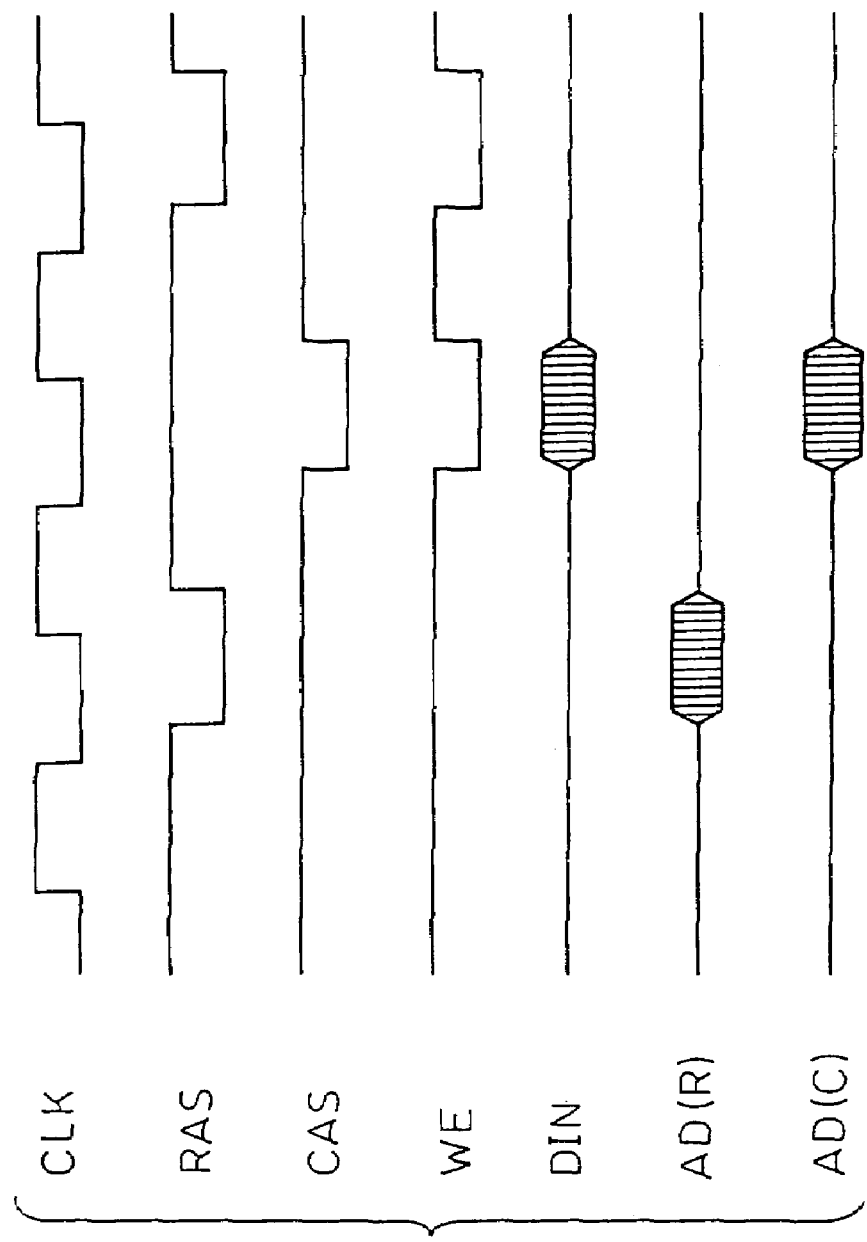
FIG. 6 shows an example of burn-in signals used to a dynamic burn-in for a general-purpose memory device according to a prior art.

FIG. 6 shows examples of the burn-in signals used by the conventional apparatus in order to burn in a general-purpose memory device such as DRAM or SRAM. The burn-in signals consist of a clock CLK, a row address strobe RAS, a column address strobe CAS, a write enable WE, a data DIN, a row address AD(R), a column address AD(C). The address is incremented and the data is written to each cell of the memory device.

Next, as shown in FIG. 1a, the dynamic burn-in apparatus according to the present invention has the signal generator 1 whose output signal is input to the semiconductor device to be tested in the burn-in tank 2, and furthermore a converter 3 in the output of the signal generator 1.

The frequency f of the signal output from the signal generator 1 is multiplied by N times (N=1, 2, . . . ) by the generator 1. The burn-in signal output from the generator 1 is input to the semiconductor device when the dynamic burn-in is operated.

If a general-purpose memory device is burned in, as shown in FIG. 1b, the converter 3 converts the clock CLK1 output from the signal generator 1 to a clock CLK2 having a period of 20 ns that is synchronized with the clock CLK1, and further converts the signals such as RAS1, CAS1 and AD1 to signals such as RAS2, CAS2 and AD2 that has a low-level width of 20 ns. The converted the signals such as CLK2, RAS2, CAS2 and AD2, output from the converter 3, are provided to the semiconductor devices in the burn-in tank 2.

FIG. 2 shows a schematic diagram of a burn-in apparatus according to the embodiment of the present invention. The burn-in apparatus has the converter 3 at the output from the signal generator 1. The converter 3 raises the frequency of the signals output from the signal generator 1 and provides a signal having a higher frequency to general-purpose semiconductor devices in the burn-in tank 2. Thus, the burn-in is accelerated. In addition, the present invention cannot only be applied to a general-purpose semiconductor device but can be applied to other kinds of semiconductor devices.

Figure 3:
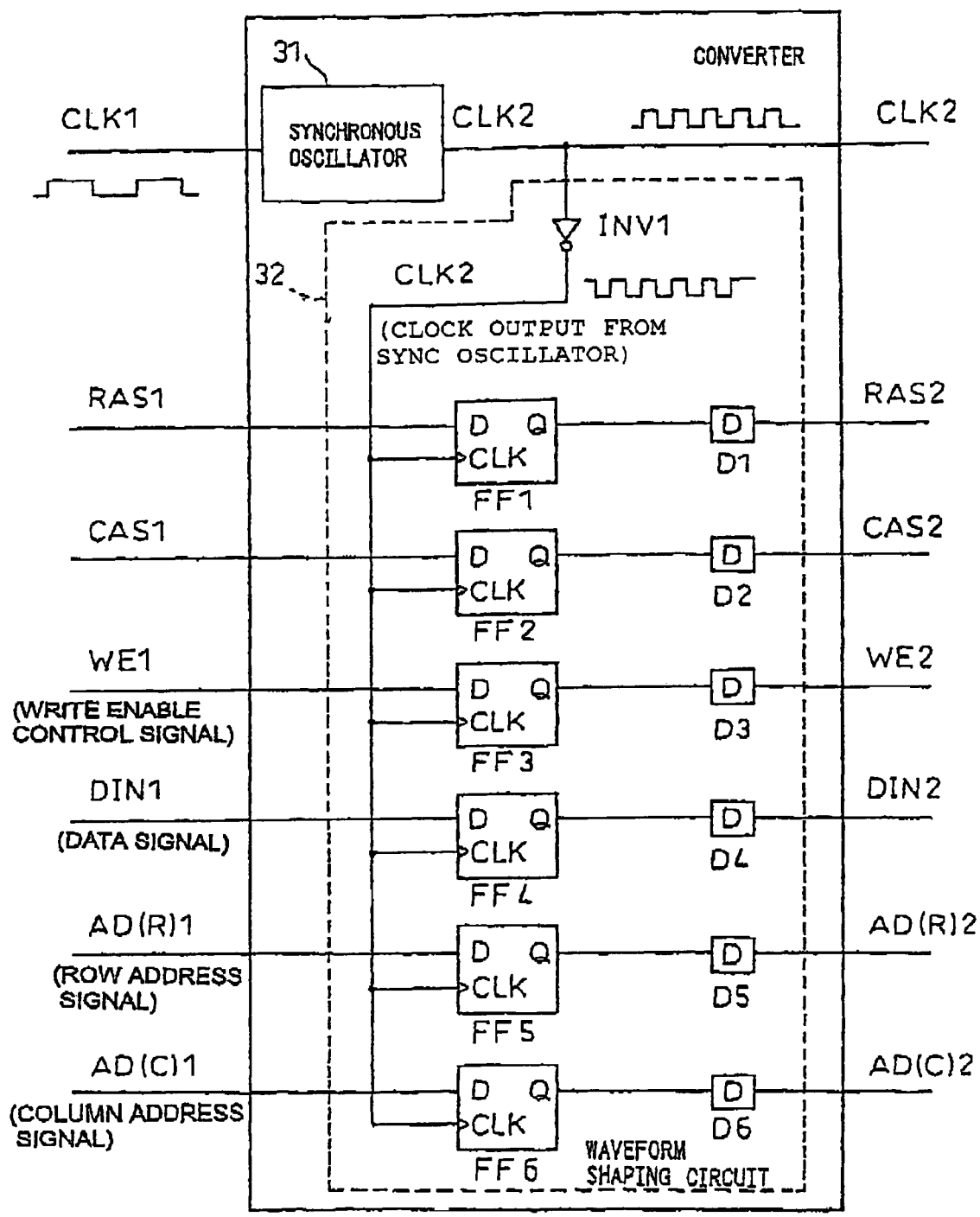
FIG. 3 shows an example of a converter according to an embodiment of the present invention.

FIG. 3 shows an example of the converter 3 according to the embodiment. The converter 3 converts a clock CLK1 having a period of 60 ns, which is output from the signal generator 1, to a clock CLK2 having a period of 20 ns.

In FIG. 3 the frequency of the signal, output from the signal generator 1, having a period of 60 ns can be increased by 3 times through a synchronous oscillator 31. Thus, the synchronous oscillator 31 can generate the clock CLK2 having a period of 20 ns that is synchronized with the clock CLK1.

A waveform shaping circuit 32 consists of an inverter INV1, flip-flops FF1 to FF6, and delay circuits D1 to D6.

The inverter INV1 can invert the clock CLK2 output from the synchronous oscillator 31. The output signal from the inverter INV1 is input to any clock input port CLK of the flip-flops FF1 to FF6.

The row address strobe RAS1, the column address strobe CAS1, the write enable WE1, the data DIN1, the row address AD(R)1 and a column address AD(C)1 are input to any data input ports D of the flip-flops FF1 to FF6. Furthermore, the delay circuits D1 to D6 can delay by a predetermined time the output signal of the flip-flops FF1 to FF6.

Figure 4:
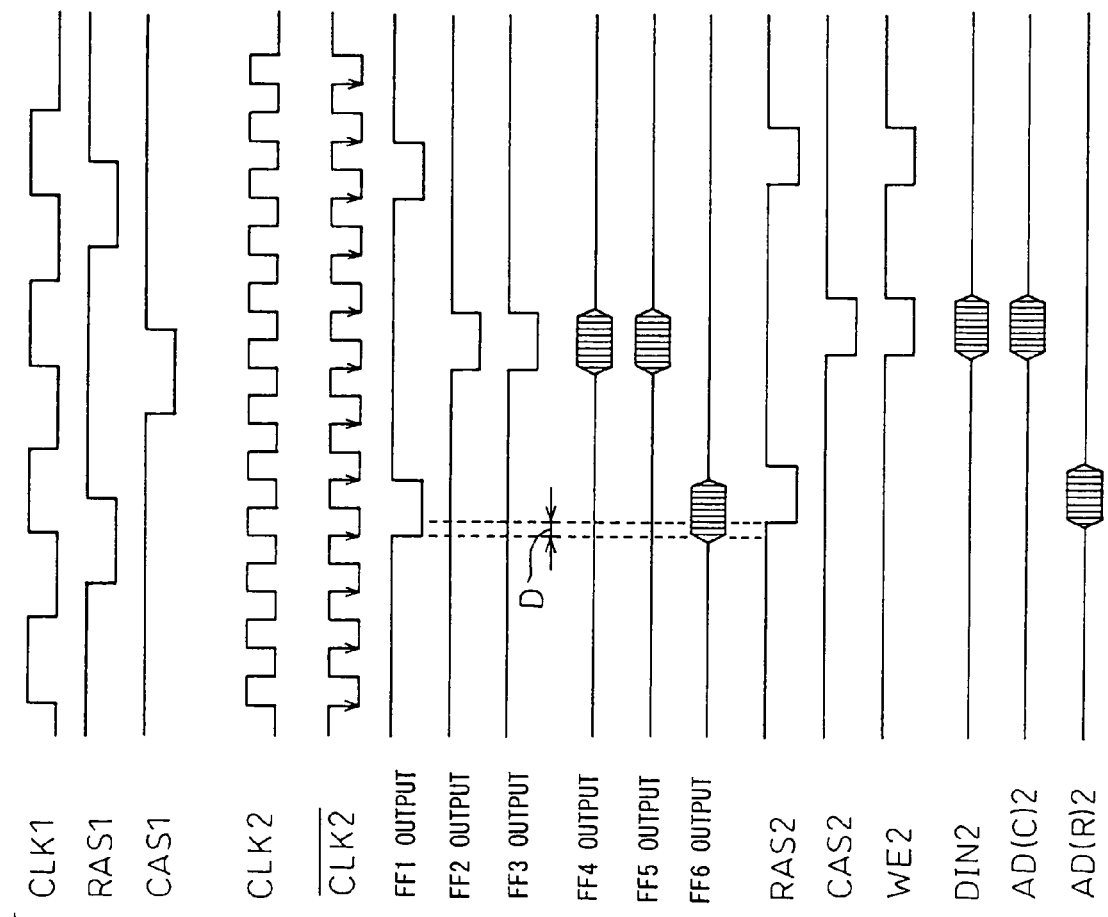
FIG. 4 shows a time chart of the converter shown in FIG. 3.

FIG. 4 shows a time chart to illustrate the operation of the converter. Hereinafter, the operation of the converter will be described with reference to FIGS. 3 and 4.

In FIG. 4, CLK1, RAS1 and CAS1 show the output signals from the signal generator 1. CLK2, RAS2 and CAS2, WE2, DIN2, AD(R)2 and AD(C)2 show the output signals from the converter 3. In addition, FIG. 4 shows only CLK1, RAS1 and CAS1 as output signals from the signal generator 1. However, signals WE1, DIN1, AD(R)1 and AD(C)1 are input to the converter 3 at the timing as shown in FIG. 6.

The clock CLK1 output from the signal generator 1 is input to the synchronous oscillator 31 as shown in FIG. 3. The synchronous oscillator 31, as shown in FIG. 4, generates a clock CLK2, which is synchronized with the clock CLK1, has a frequency n times the frequency of the clock CLK1. The clock CLK2 is provided to the semiconductor devices in the burn-in tank 2 and the waveform shaping circuit 32.

The inverter INV1 that is arranged in the waveform shaping circuit 32 inverts the clock CLK2. The inverted clock CLK2 is input to the clock ports of the flip-flop circuits FF1 to FF6. The flip-flop circuits FF1 to FF6 latch the value of the signals WE1, DIN1, AD(R)1 and AD(C)1 at the falling edge of the signal output from the inverter INV1.

Thus, the signals Q output from the flip-flop circuits FF1 to FF6, as shown in FIG. 4, become low-level in the range of 20 ns whenever the signals WE1, DIN1, AD(R)1 and AD(C)1 are input.

The output signals Q of the circuits FF1 to FF6 are input to the delay circuits D1 to D6 and delayed by a certain time. As a result that the signals Q are output as the signals RAS2, CAS2, WE2, DIN2, AD(R)2 and AD(C)2. These signals, which are burn-in signals, are provided to the semiconductor devices in the burn-in tank, as shown in FIG. 2.

The burn-in apparatus according to the embodiment, as described above, has a converter 3. The converter can increase the frequency of the burn-in signal output from the signal generator 1. The burn-in signal that has a higher frequency is provided to the semiconductor devices in the burn-in tank. Thus, the burn-in is operated in a shorter time for a high-speed sophisticated semiconductor device.

Further, the burn-in is operated at an accelerated rate by the burn-in apparatus that is arranged by adding the converter, which is relatively simple, to the conventional burn-in apparatus. The cost of the embodiment can be lower than that of the burn-in apparatus that has a signal generator that can generate a clock having a high frequency.

The burn-in apparatus according to the embodiment can change the period of the clock from 60 ns to 20 ns and the width of the low-level of signals such as RAS2, CAS2 and WE2 from 30 ns to 20 ns. However, if the low-level of signals such as RAS2, CAS2 and WE2 is changed from 30 ns to 10 ns, the burn-in is easily operated at the accelerated rate.

As described above, the burn-in apparatus according to the embodiment can change the period of the clock from 60 ns to 20 ns. However the present invention is not limited to the embodiment. The frequency of the clock can be appropriately selected corresponding to the kind of semiconductor device.

Thus, the present invention has following advantageous effects.

(1) As the dynamic burn-in is done at high speed, the rate of detection of defects due to initial deterioration can increase by several times.

(2) As the number of stresses that are given to the semiconductor device increase by N times when the dynamic burn-in is operated, the time of the burn-in can decrease 1/N times.

(3) As the burn-in apparatus is arranged by adding the converter to the conventional burn-in apparatus, a burn-in for a high-speed semiconductor device can be done at a high speed by the apparatus without a new burn-in apparatus for the high-speed semiconductor device.

A dynamic burn-in apparatus for a semiconductor device, wherein a signal output from a signal generator is provided to a semiconductor device to be tested in the burn-in tank, comprising: a converter that is added at the output of the signal generator and located outside of the semiconductor device, wherein the frequency of the signal output from the signal generator is increased by the converter and the signal output from the converter is provided to the semiconductor device. In one embodiment, the converter comprises a synchronous oscillator and a waveform shaping circuit, wherein the synchronous oscillator is synchronized with a clock output from the signal generator and generates a clock having higher frequency than that of the clock output from the signal generator, and the waveform shaping circuit shapes a control signal (such as, for example, the write enable control signal WE1), a data signal (such as, for example, data signal DIN1) and an address signal output from the signal generator into the control signal, the data signal and the address signal that have the width corresponding to the clock output from the synchronous oscillator, wherein the clock output from the synchronous oscillator and the control signal, the data signal and the address signal output from the waveform shaping circuit are provided to the semiconductor device.

What is claimed is:

1. A dynamic burn-in apparatus for a semiconductor device, wherein a signal output from a signal generator is provided to a semiconductor device to be tested in the burn-in tank, comprising:

a converter that is added at the output of the signal generator and located outside of a substrate supporting the semiconductor device, wherein the frequency of the signal output from the signal generator is increased by the converter and the signal output from the converter is provided to the semiconductor device.

2. A dynamic burn-in apparatus of claim 1, wherein the converter comprises a synchronous oscillator and a waveform shaping circuit, wherein the synchronous oscillator is synchronized with a clock output from the signal generator and generates a clock having higher frequency than that of the clock output from the signal generator, and the waveform shaping circuit shapes a control signal, a data signal and an address signal output from the signal generator into the control signal, the data signal and the address signal that have the width corresponding to the clock output from the synchronous oscillator, wherein the clock output from the synchronous oscillator and the control signal, the data signal and the address signal output from the waveform shaping circuit are provided to the semiconductor device.

3. A dynamic burn-in apparatus for a semiconductor device, wherein a signal output from a signal generator is provided to a semiconductor device to be tested in a burn-in tank, comprising:

a converter that is arranged at the output of the signal generator, wherein the frequency of the signal output from the signal generator is increased by the converter and the signal output from the converter is provided to the semiconductor device, wherein the semiconductor device is a general-purpose memory device, the converter comprises a synchronous oscillator and a waveform shaping circuit, wherein the synchronous oscillator is synchronized with a clock output from the signal generator and generates a clock having higher frequency than that of the clock output from the signal generator, and the waveform shaping circuit shapes a control signal, a data signal and an address signal output from the signal generator into the control signal, the data signal and the address signal that have a width corresponding to the clock output from the synchronous oscillator, and wherein the clock output from the synchronous oscillator and the control signal, the data signal and the address signal output from the waveform shaping circuit are provided to the semiconductor device.

4. A dynamic burn-in apparatus for a semiconductor device, wherein a signal output from a signal generator is provided to a semiconductor device to be tested in a burn-in tank, comprising:

a converter arranged at the output of the signal generator and outside of a substrate supporting the semiconductor device, wherein the converter increases, by N times, N a positive integer, a frequency of the signal output from the signal generator and outputs the signal having the increased frequency to the semiconductor device to be tested in the burn-in tank to implement expedited dynamic burn-in, increasing a rate of detection of defects due to initial deterioration.

* * * * *